United States Patent [19]
Christopher

[11] Patent Number: 4,694,414
[45] Date of Patent: Sep. 15, 1987

[54] DIGITAL DELAY INTERPOLATION FILTER WITH AMPLITUDE AND PHASE COMPENSATION

[75] Inventor: Todd J. Christopher, Indianapolis, Ind.

[73] Assignee: RCA Corporation, Princeton, N.J.

[21] Appl. No.: 683,678

[22] Filed: Dec. 19, 1984

[51] Int. Cl.[4] ............................................. G06F 7/38
[52] U.S. Cl. .................................... 364/724; 364/723
[58] Field of Search ............ 364/723, 724; 358/21 R, 358/36, 140

[56] References Cited

U.S. PATENT DOCUMENTS

| | | | |
|---|---|---|---|
| 4,263,671 | 4/1981 | Chiu et al. | 364/724 |
| 4,302,631 | 11/1981 | Shenoi et al. | 364/724 |
| 4,313,173 | 1/1982 | Candy et al. | 364/724 |
| 4,400,719 | 8/1983 | Powers | 358/21 R |

Primary Examiner—Gary V. Harkcom
Assistant Examiner—Dale M. Shaw
Attorney, Agent, or Firm—E. M. Whitacre; P. M. Emanuel; R. G. Coalter

[57] ABSTRACT

A digital input signal to be delayed is applied to a two-point linear interpolation filter which imparts delay to the signal proportional to the value of a delay control signal. Errors in both the amplitude and the phase of the delayed signal are minimized by the addition of a correction signal to the delayed signal. The correction signal is provided by applying the input signal to a further filter and a multiplier connected in cascade. The further filter is a linear phase filter having a response zero at zero frequency and a delay equal to an add multiple of one-half of the sampling period, Ts, of the digital input signal. The multiplier is controlled so as to vary the amplitude of the compensating signal as a non-linear function of the delay control signal so as to provide maximum amplitude compensation at delays corresponding to odd multiples of Ts/2 and zero amplitude compensation at delays equal to integer multiples of Ts.

8 Claims, 15 Drawing Figures

| 1−K | K | C | DELAY CHANGE | TOTAL DELAY |
|---|---|---|---|---|
| 1 | 0 | 0 | 0 | Ts |
| 7/8 | 1/8 | 1/32 | Ts/8 | 9 Ts/8 |
| 6/8 | 2/8 | 2/32 | Ts/4 | 10 Ts/8 |
| 5/8 | 3/8 | 3/32 | 3 Ts/8 | 11 Ts/8 |
| 4/8 | 4/8 | 3/32 | Ts/2 | 12 Ts/8 |
| 3/8 | 5/8 | 3/32 | 5 Ts/8 | 13 Ts/8 |
| 2/8 | 6/8 | 2/32 | 3 Ts/4 | 14 Ts/8 |
| 1/8 | 7/8 | 1/32 | 7 Ts/8 | 15 Ts/8 |
| 0 | 1 | 0 | Ts | 2Ts |

Fig.13

ROM

DELAY $= (\frac{K}{8} + 1)$Ts

| K | C |
|---|---|
| 0 | 0 |
| 1 | 1 |
| 2 | 2 |
| 3 | 3 |
| 4 | 3 |
| 5 | 3 |
| 6 | 2 |
| 7 | 1 |

Fig.14

ROM

DELAY $= (\frac{K}{16} + 1)$Ts

| K | C |
|---|---|
| 0 | 0 |
| 1 | 1 |
| 2 | 1 |
| 3 | 2 |
| 4 | 2 |
| 5 | 3 |
| 6 | 3 |
| 7 | 3 |
| 8 | 3 |
| 9 | 3 |
| 10 | 3 |
| 11 | 3 |
| 12 | 2 |
| 13 | 2 |
| 14 | 1 |
| 15 | 1 |

Fig.15

DIGITAL DELAY INTERPOLATION FILTER WITH AMPLITUDE AND PHASE COMPENSATION

FIELD OF THE INVENTION

This invention relates to apparatus for imparting delay to digitized signals in fractional increments of the signal sampling period.

BACKGROUND OF THE INVENTION

In certain applications it is desirable to convert an analog signal to digital form for processing as is done, for example, in presently commercially available digital audio disc players and in video equipment such as standards converters, frame synchronizers and time-base correctors. Also, television receivers have been proposed in which a substantial portion of the video processing, including interlace to non-interlace scan conversion (i.e., "progressive" scanning), is performed with digital rather than analog circuit elements. In such apparatus it is desirable to be able to impart delay to the signal in fractional increments of the sampling period for such purposes, for example, as correcting timing errors.

Once an analog signal has been converted to digital form, its value is known exactly only at the particular instants when it was sampled. In applications where it is desired to delay the signal by a fraction of the sampling interval, the usual approach is to "estimate" or interpolate the delayed signal from two or more adjacent samples of the input signal. FIG. 1 herein is exemplary of a known form of "two-point" linear interpolation filter 10 which uses a weighted sum of delayed and non-delayed signals to generate an estimate of a signal delayed by a fraction (K) of the signal sampling interval. As will be explained in detail subsequently, the delay of filter 10 varies as a function of the frequency of the signal to be delayed for delays other than those corresponding to integer multiples of one-half of the signal sampling interval. Moreover, the amplitude response of filter 10 undesirably varies as a function of frequency and the selected delay (K) of the filter.

The deficiencies in the amplitude and phase response of filter 10 tend to limit its usefulness to applications where the maximum input signal frequency is but a small fraction (e.g., one-eighth) of the sampling frequency. One solution to the problem would be to increase the sampling frequency but such a solution is not always practical in applications where the sampling frequency is fixed by other system design parameters, cost considerations or industry standards. This is the case, for example, in consumer products such as digital television receivers, digital audio disc players or the like.

Another possible solution would be to provide the desired delay by means of a "higher-order" interpolator which utilizes more samples of the input signal in forming the delayed signal. Quadratic interpolators, for example, form a weighted sum of four samples of the input signal in generating a delayed signal and have superior amplitude and phase response as compared with two-point linear interpolators. As to be expected, however, the improved performance of higher-order interpolators is obtained at the cost of substantially increased circuit complexity particularly with regard to the number of complex digital arithmetic operations which must be performed such as multiplication by variables and additions of numbers.

SUMMARY OF THE INVENTION

Delay appartus in accordance with the invention comprises sources for providing a digital input signal having a given sampling rate and a delay control signal. A first filter means delays the digital input signal as a function of the delay control signal in fractional increments of the sampling period by linear interpolation of adjacent samples of the digital input signal. A second filter means having a response zero at zero frequency and a delay equal to an odd multiple of one-half the sampling period, filters the digital input signal to provide a compensating signal which is combined by an output means with the delayed digital signal to provide a resultant signal. Amplitude control means, coupled with the second filter means, controls the amplitude of the compensating signal as a predetermined function of the delay control signal for minimizing variations in both the amplitude and the delay of said resultant signal for different frequency components of said input signal.

BRIEF DESCRIPTION OF THE DRAWING

The invention is illustrated in the accompanying drawing wherein like elements are denoted by like reference designators and in which:

FIGS. 13, 14 and 15 are tables of multiplier coefficients associated with the apparatus of FIGS. 6, 11 and 12, respectively.

DETAILED DESCRIPTION

Figure 1:
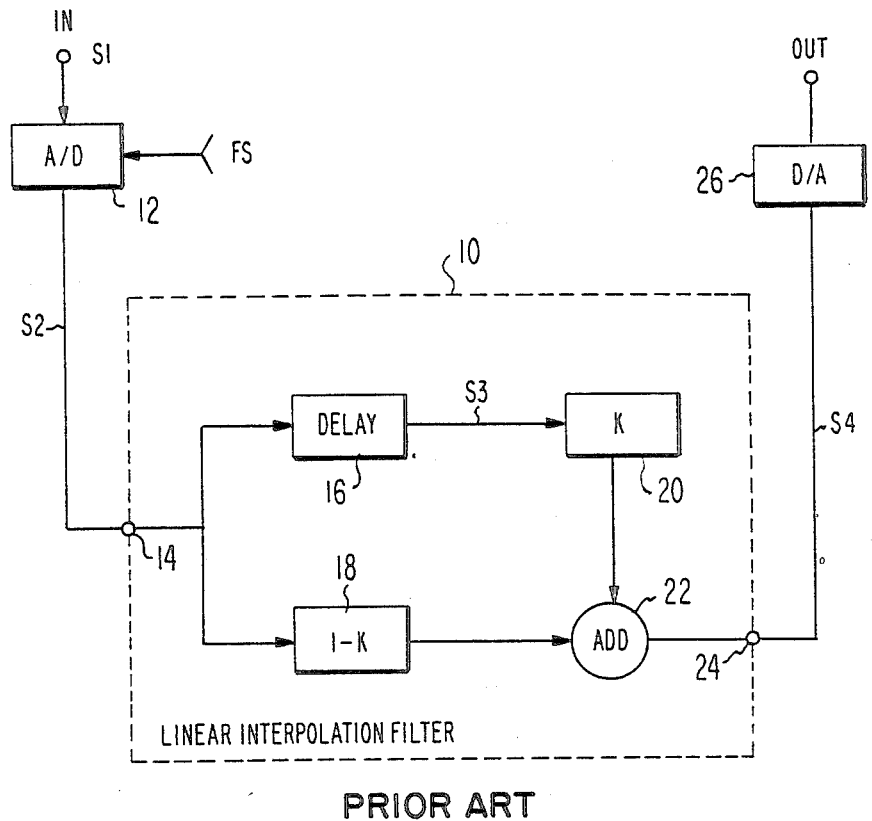
FIG. 1 is a block diagram of a known form of digital delay apparatus employing a two-point linear interpolation filter.

It is helpful to an understanding of the present invention to consider first certain salient features and deficiencies of the known delay apparatus of FIG. 1. An analog signal S1 is applied to the input of an analog-to-digital (A/D) converter 12 which receives a clock or "sampling" signal of frequency Fs from a suitable source (not shown) and provides a digital output signal S2 having a sample period, Ts, equal to the reciprocal of the conversion of sampling frequency, Fs. For purposes of illustration it will be assumed that signal S1 is a video signal and that the sampling signal Fs has a frequency equal to four-times the color subcarrier reference frequency of signal S1. For NTSC standard signals, Fs would be 4×3.579545 MHz and the sample period Ts would be about 70 nano-seconds. Video analog-to-digital converters typically provide a resolution on the order of eight bits and provide an output in parallel form. To simplify the drawing, a single line is used to represent a parallel signal bus. It will be appreciated that signal S1 may be other than a video signal and processing may be performed on signal S2 in serial rather than parallel form. Parallel processing of digitized video signals is preferred, however, to avoid the need for exceptionally high speed logic elements.

The digital signal S2 is applied to the input 14 of linear interpolation filter 10 which includes a delay element 16 for delaying signal S2 by one sample period, Ts. Element 16, illustratively, may comprise an eight-bit parallel latch or data buffer clocked by signal Fs. The non-delayed signal S2 and the delayed signal S3 are applied via respective multipliers 18 and 20 to an adder 22 having an output 24 for supplying a delayed digital output signal S4 to a digital-to-analog converter (D/A) 26 for conversion back to analog form. Various types of digital video processing apparatus may be inserted between converter 12 and input 14 and/or between output 24 and converter 26.

Figure 2:
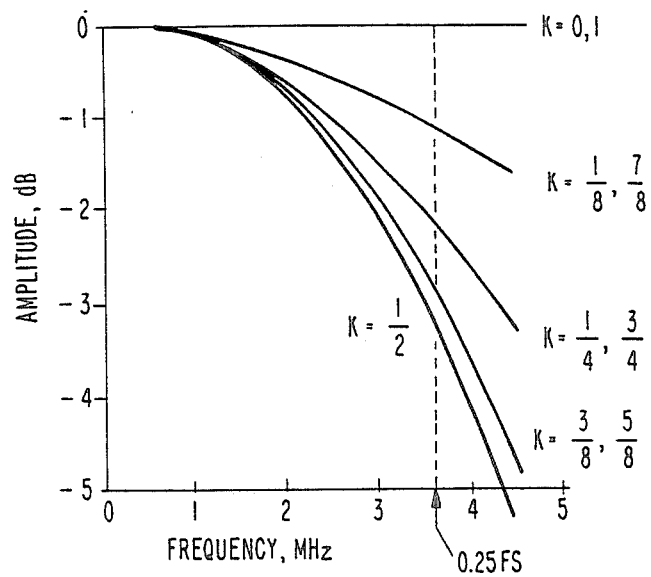
FIG. 2 is a diagram illustrating the frequency response of the apparatus of FIG. 1 as a function of delay.

Multipliers 18 and 20 multiply signals S2 and S3 by factors of 1−K and K, respectively, where K is a fraction which may be varied from zero to unity in response to a control signal (not shown) to control the delay. The delay provided by filter 10 at DC and very low frequencies (e.g., frequencies an order of magnitude below the sampling frequency Fs) is given simply by the product KTs. At higher frequencies the delay may be constant, it may increase or it may decrease depending on the value of K. The group delay (i.e., the rate of change of phase with frequency) of the filter 10 is shown by the solid lines in FIG. 10 which represent the group delay characteristics of filter 10 as a function of both frequency and the variable K. For purposes of comparison with apparatus embodying the invention, one clock period delay (i.e., 70 nano-seconds) has been added to the group delay scale in the drawing. Note that for values of K of $\frac{1}{8}$, 2/8 and 3/8 the group delay decreases with frequency but for values of 5/8, 6/8 and 7/8 it increases. The group delay is constant only for values of K of 0, $\frac{1}{2}$ and 1. The amplitude response of filter 10, as shown in FIG. 2, decreases rapidly with frequency for values of K other than zero or unity, the worst case being K=$\frac{1}{2}$ where, as shown, the amplitude error exceeds 3 dB at a frequency of one-quarter of the sampling frequency, Fs.

Figure 3:
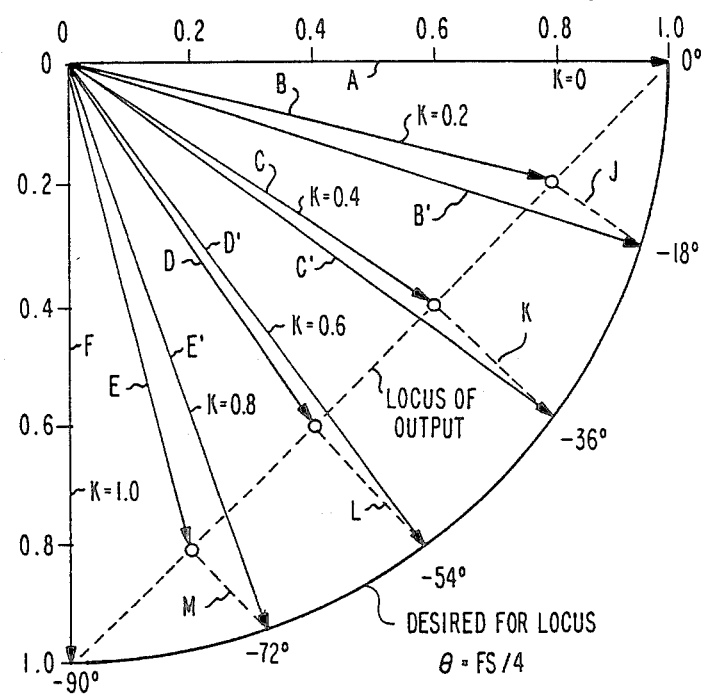
FIG. 3 is a phasor diagram illustrating operation of the apparatus of FIG. 1.

The foregoing is summarized for the particular frequency equal to 0.25 Fs (i.e, 3.579545 MHz) by the phasor diagram of FIG. 3 where phasors A−F show the amplitude and phase of signal S4 with respect to signal S2 for values of K ranging in steps of 0.2 between zero (no delay) and unity (one sample interval delay). As shown, the locus of the output signal S4 lies on a straight line (dashed) whereas the desired output signal (if there were no amplitude and phase errors) should lie on a unit circuit delined by constant amplitude equally spaced phasors A, B'−E' and F. As shown, substantial errors exist in both amplitude and phase. The maximum amplitude error occurs when the delay factor K equals 0.5 (not shown) and is zero at values of K=0 and K=1. Phase errors are zero at values of K=0, 0.5 and 1. Phase error maxima occur when K is in the ranges 0–0.5 and 0.5–1 and are in opposite directions in those intervals.

Figure 4:
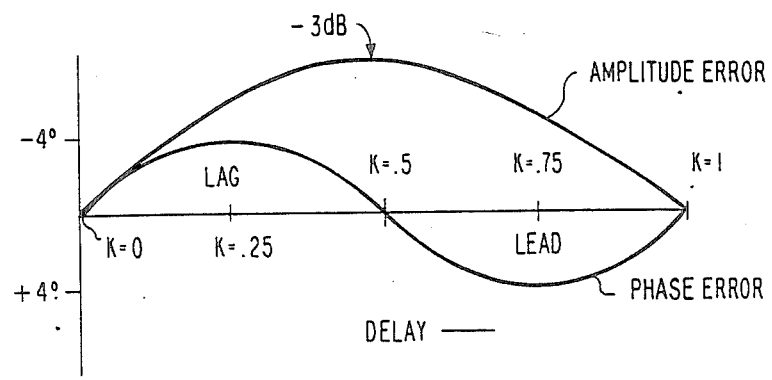
FIG. 4 is a diagram illustrating amplitude and phase errors as a function of delay for the interpolation filter of FIG. 1.

The amplitude and phase errors characteristic of linear interpolation filter 10, as indicated by the phasor diagram of FIG. 3 for the particular frequency 0.25 Fs, are redrawn in FIG. 4 to emphasize certain aspects of the problem to which the present invention is directed. One such aspect is that the amplitude error and the phase error are each quite different functions of the delay control variable K and both types of errors are also functions of frequency. Since the phase errors possess a different functional dependence on the variable K than the amplitude errors, one might reasonably conclude that separate networks, each having unique dependencies on frequency and the variable "K", would be required to correct the amplitude and phase errors of filter 10. Such an approach to the problem however, can easily lead to a structure having the complexity of a higher ordered interpoation filter.

The present invention resides in part in the recognition of a specific relationship between four of the six phasors A–F in FIG. 3 and in part in applying the relationship of the selected ones of phasors A–F to the design of a single network that corrects errors in both the amplitude and the phase of the linear interpolator of FIG. 1.

Figure 5:
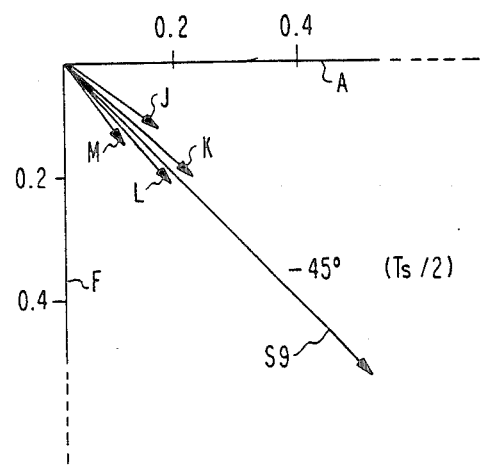
FIG. 5 is a portion of the phasor diagram of FIG. 3 redrawn to illustrate one aspect of the present invention.

It is herein recognized that the phasors J, K, L, and M in the phasor diagram of FIG. 3 all point in very nearly the same direction, that is, they are almost parallel in the phasor diagram. This relationship is shown more clearly in FIG. 5 where the phasor diagram is partially redrawn with phasors, J, K, L and M moved to the origin. In delay apparatus embodying the invention, the phasors J, K, L and M are approximated by means of a single correction signal having a substantially constant delay with respect to the input signal S2 equal to an odd multiple of one-half Ts and an amplitude dependent on frequency and the delay control variable "K" as will be explained. In FIG. 5, the delay (Ts/2) of the correction phasor S9 corresponds to an angle of −45 degrees at the frequency of Fs/4. Phasor S9 is seen, at this frequency, to be fairly representative of the direction of the phasors J, K, L and M which, it will be recalled, represent the errors characteristic of filter 10 at frequency 0.25 Fs.

Figure 7:
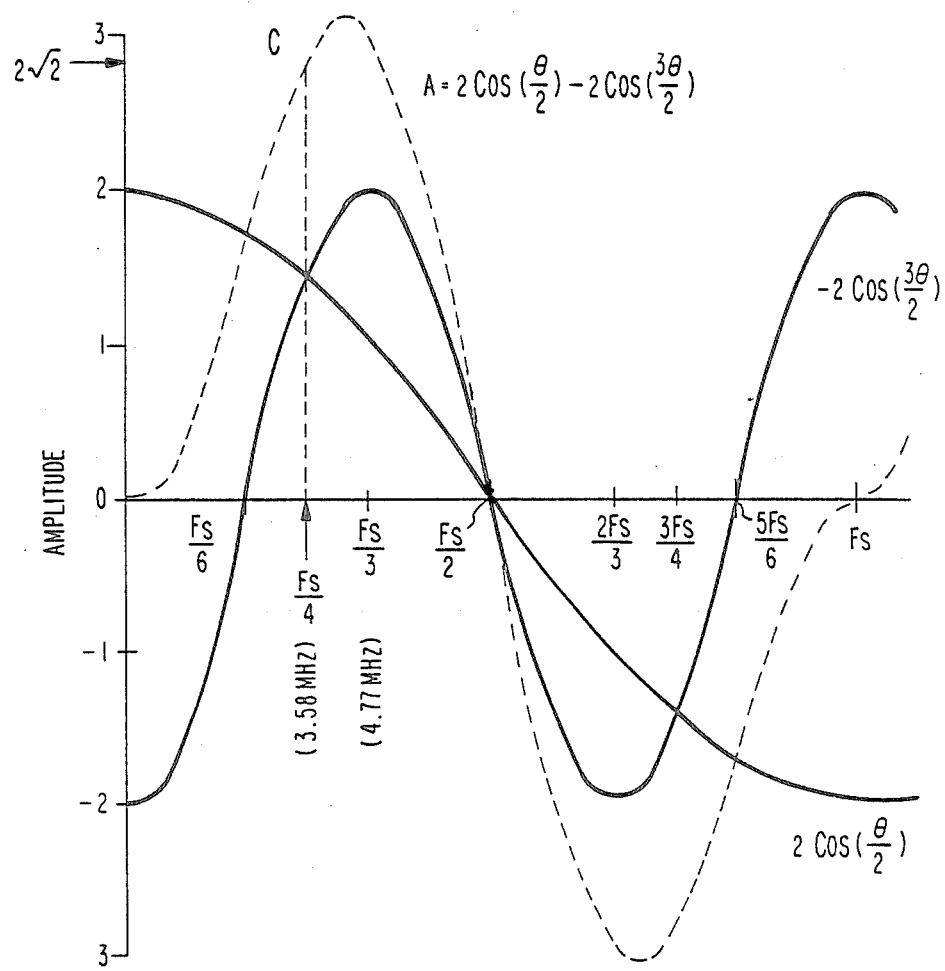
FIG. 7 is a diagram illustrating the amplitude response of filter 40 in the apparatus of FIG. 6.
Figure 8:
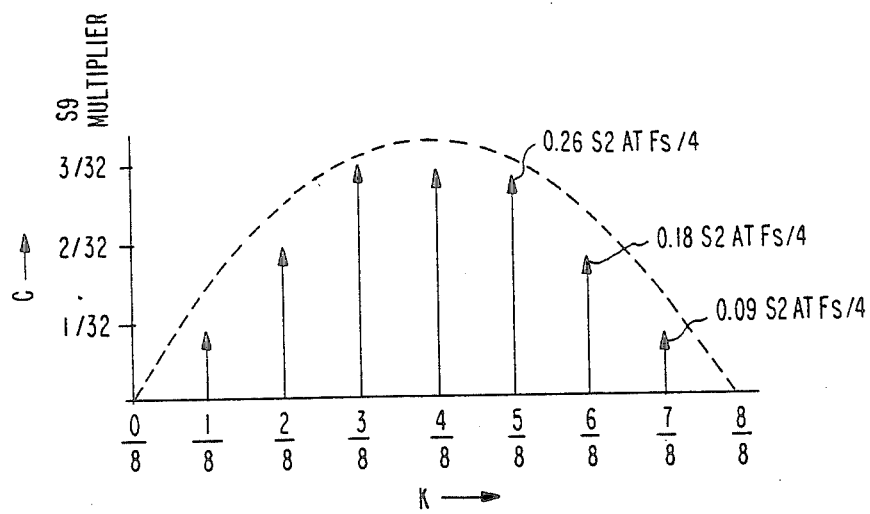
FIG. 8 is a diagram illustrating non-linear amplitude control in the apparatus of FIG. 6.

Since phasor S9 is generated by delaying S2 by a fixed time period, the phase of phasor S9 is thus a linear function of frequency and therefore phasor S9 will "track" phasors J, K, L and M at other frequencies. If, for example, the input signal frequency is reduced to Fs/8, then phasors J, K, L and M will all point generally in the direction −22.5°. So too will phasor S9 because the delay of Ts/2 at a frequency of S/8 corresponds to an eighth of the period of the input signal. The amplitude characteristic of phasor S9, as will be explained with reference to FIGS. 7 and 8, are controlled as a non-linear function of the variable K and vary with frequency such that this single correction signal corrects both amplitude and the phase errors of the output signal S4 of filter 10.

Figure 6:
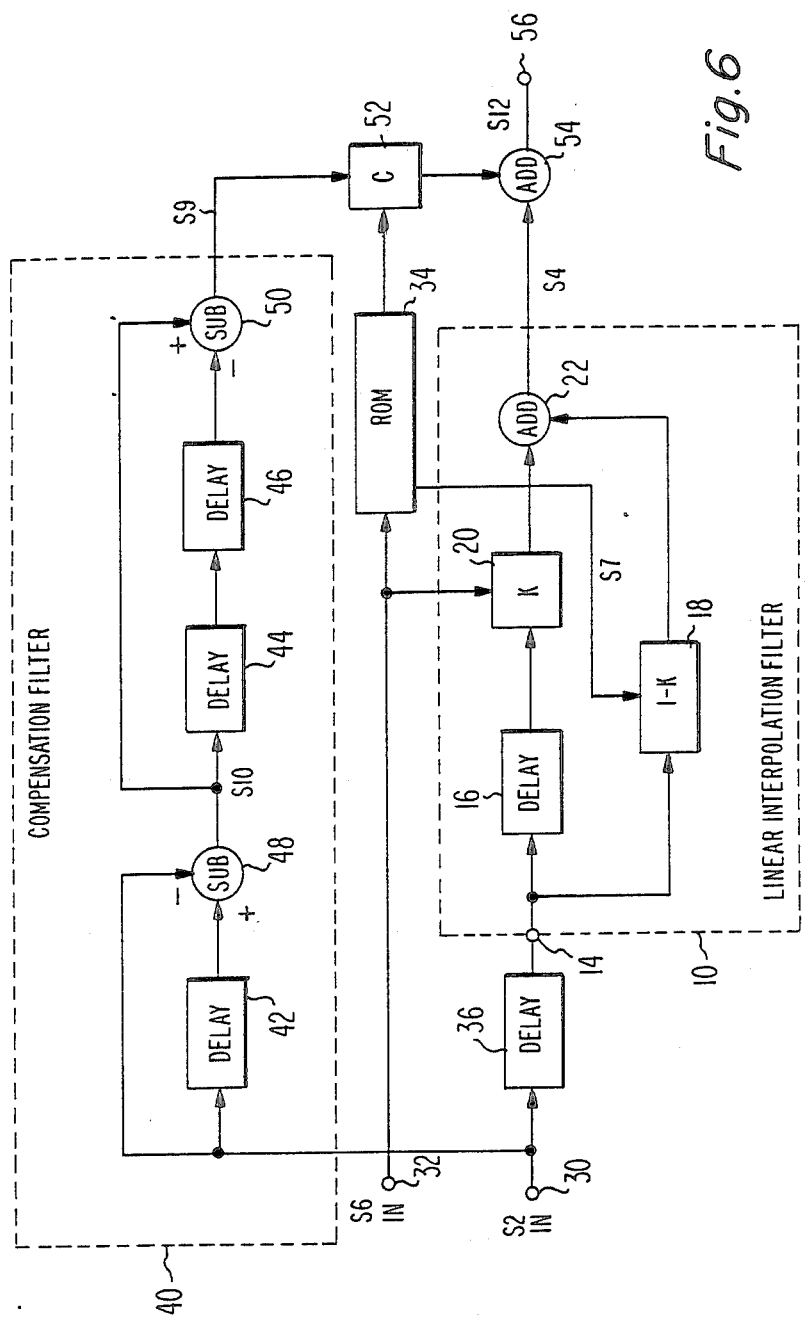
FIG. 6 is a block diagram of delay apparatus embodying the invention.

In the example of the invention shown in FIGURE 6, the amplitude and phase errors of filter 10 represented by phasors J, K, L and M of FIG. 3 are substantially reduced over a broad frequency range with minimal amplitude overshoot and nearly constant group delay by the addition to signal S4 of a compensation signal S9 derived from signal S2 having certain controlled amplitude and specified delay characteristics. As will be explained in detail subsequently, the compensation signal is generated by the combination of a filter having a delay of an odd multiple of one half the sampling period and zero amplitude response at zero frequency, and an amplitude control device which varies the amplitude of the compensating signal as a non-linear function of the delay controlling variable K.

In FIG. 6, the digital input signal S2 to be delayed (from A/D converter 12, not shown) is applied to an input 30 and the delay control signal (S6) is applied to a delay control input 32. As in the discussion of FIG. 1, signal S2 is assumed to be a video signal digitized with a sample period, Ts, of about 70 nano-seconds and the delay control signal (also digital) represents a fractional number, K, ranging between zero and unity. Signal SG is applied directly to multiplier 20 in filter 10 and via a read-only-memory (ROM) 34 to multiplier 18 for controlling the delay provided by filter 10 as previously described. ROM 34 is programmed as shown in the table of FIG. 13 for generating the control signal S7 to be equal to $1-K$ from the control signal S6 which equals K. As shown, as K varies in steps of $\frac{1}{8}$ from zero to unity, the signal S7 (K−1) varies in steps of $\frac{1}{8}$ from unity to zero and the delay provided by filter 10 varies in steps of one-eighth of the sample period Ts from 0 to Ts.

Signal S2 is applied to the input 14 of filter 10 via a delay unit 36 having a delay of Ts (70 nano-seconds). Consequently, the total delay of the output signal S4 of filter 10 with respect to the input signal S2 varies from a minimum value of Ts for K=0 to a maximum value of 2Ts for K−1 as shown in FIG. 13. This corresponds to a delay range of 70 to 140 nano-seconds for the particular sampling frequency assumed (i.e., four times the color subcarrier frequency). In this example of the invention, delay unit 36 could either precede or follow the linear interpolation filter 10 in the cascade connection of elements.

The reason that a fixed minimum delay is added to the signal S4 is that the particular filter 40, selected for generating the compensation signal S9 that is ultimately added to signal S4 to correct amplitude and phase errors, is of a type having a delay of 3Ts/2. In accordance with an aspect of the invention, the delay of the compensating filter 40 should be one-half of one sample period (Ts/2) with respect to signal S4 when filter 10 is set at its minimum delay (zero). Stated another way, the minimum delay of the signal path including filter 10 should be selected such that the delayed signal S4 and the compensating signal S9 experience equal delays when filter 10 is set to provide a delay of Ts/2. The Ts delay provided by unit 36 ensures that these relative delay conditions are met. If the form of filter 40 is changed such that its delay is a higher odd multiple of one-half Ts, then additional delay should be added to the interpolation filter signal path. Conversely, if the delay of filter 40 is reduced to Ts/2, then delay unit 36 may be deleted.

The amplitude and phase compensation signal S9 is generated by applying the input signal to a network comprising a compensation filter 40 and a multiplier 52 connected in cascade. Neither of these elements, taken alone, is capable of correcting either phase errors or amplitude errors. When combined, however, the resultant compensating signal corrects both types of errors.

In the combination, filter 40 provides the dual functions of (1) delaying signal S2 by an odd-multiple of one-half the sample period (in this case, 3Ts/2) and (2) controlling the amplitude of the compensating signal as a function of frequency. Generally, the amplitude response should increase with frequency throughout all or most of the frequency range of the input signal S2. Multiplier 52 further varies the amplitude of signal S9 as a non-linear function of the delay control signal (S6) to provide maximum compensation for delays corresponding to odd-multiples of Ts/2 and minimal (zero) compensation for delays corresponding to integer multiples of Ts.

There are many possible implementations of filter 40 having the characteristics of (1) a rising amplitude vs. frequency characteristic and (2) a substantially constant delay of an odd-multiple of one-half the sampling period, Ts. The specific filter shown in FIG. 6 as filter 40 is a linear phase (i.e., constant delay) filter having a delay of 3Ts/2 and an amplitude characteristic, A, given by:

$$A = 2 \cos(\theta/2) - 2 \cos(3\theta/2) \quad (1)$$

where $\theta$ represents frequency in radians per second. This function is plotted in FIG. 7 where it is seen that the response is a periodic function of Fs/2.

Of importance to the present invention, the amplitude response is a minimum (zero) at zero frequency and generally increases with frequency throughout the frequency range of the input signal S2. Recall that signal S2 is assumed to be a digitized video signal. To prevent aliasing, it is customary practice to limit the bandwidth of video signals prior to A/D conversion. For NTSC signals, the maximum luminance signal bandwidth extends to a frequency of about 4.2 MHz or so. The amplitude response of filter 40, as shown, extends to nearly Fs/3 (4.77 MHz) before peaking and thus exceeds the input signal frequency range. Although this feature of the invention is highly desirable, as it provides superior overall group delay characteristics, the useful range of correction extends beyond the peak of waveform A to a frequency slightly greater than Fs/3. Useful response to even higher frequencies may be obtained by adding additional filter sections to filter 40 if desired. To reiterate, the more important characteristics, for purposes of the present invention, are that the delay be an odd-multiple of Ts/2 and that the amplitude response increase with frequency over a substantial portion (preferably all) of the frequency range of the input signal.

The scale of FIG. 7 is normalized with respect to the input signal S2, that is, signal S2 is assumed to be of unit magnitude. Accordingly, the vertical scale represents the gain of filter 40 for signal S2. The filter gain, as shown, is independent of the delay control variable K and has a value of about 2.8 at the frequency Fs/4 as indicated by point "C". From FIGS. 2, 3 and 4 it is seen that the amplitude error is on the order of 3 dB maximum for K=0.5 and decreases as K approaches zero and unity. Multiplier 52 provides attenuation of signal S9 and varies the attenuation as a function of K as shown in FIG. 8 where "C" represents the multiplitier gain. Accordingly, at the specific frequency Fs/4, the overall gain of filter 40 and multiplier 52 for K=3/8, 4/8 and 5/8 equals 3/32 times 2.8 which is about 0.26. The gain varies in discrete steps of K/8 and equals 0.18 for K=2/8 and 6/8 and 0.09 for K=$\frac{1}{8}$ and K=7/8. The gain is zero for K=0 and K=1. At other frequencies the gain varies as shown in FIG. 7 and equals the product of the K-dependent variable "C" from FIG. 8 and the filter gain from FIG. 7.

Considering now the details of construction of filter 40, the filter function expressed in terms of Z-transform notation is given by:

$$H(z) = 1 + Z^{-1} + Z^{-2} - Z^{-3} \qquad (2)$$

This transfer function indicates that the output signal (S9) comprises the sum of the input signal (S2) delayed by Ts and the input signal delayed by 2Ts minus the current value of the input signal minus the input signal delayed by 3Ts. This function is realized in filter 40 by means of three delay elements 42, 44 and 46, each providing a delay equal to the sample periods Ts, and two subtractors 48 and 50. Terminal 30 is coupled directly to the minus input of subtractor 48 and via delay element 42 to the plus input of subtractor 48 thereby providing a signal (S10) at the subtractor 48 output equal to the input signal delayed by Ts minus the undelayed input signal. Signal S9 is obtained at the output of subtractor 50 by applying signal S10 directly to the plus input of subtractor 50 and via cascade connected delay elements 44 and 46 to the minus input of subtractor 50.

The compensation signal S9 produced by filter 40 is applied via multiplier 52 to an adder 54 which receives signal S4 at its other input and provides a compensated signal S12 to output 56. Signal S12 may be converted back to analog form by a D/A converter (not shown) if desired or it may receive additional digital processing in a given application.

Figure 9:
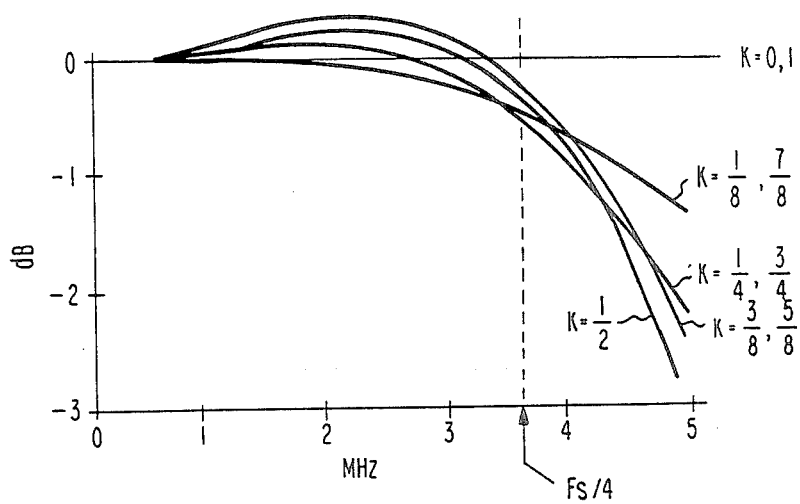
FIG. 9 is a plot illustrating the overall amplitude response as functions of frequency and delay of the apparatus of FIG. 6.

Multiplier 52 is controlled by ROM 34 to vary the amplitude of the compensation signal S9 as a non-linear function of the value of delay control signal S6 as discussed with regard to FIG. 8. The table of FIG. 13 provides a listing of the values of 1−K, K, C, the delay change and the total delay. FIG. 9 is a plot of the overall frequency response of the apparatus of FIG. 6. Note that for all values of K shown in FIG. 9 the amplitude variations are less than about one-half dB from zero frequency up to one-quarter of the sampling frequency (0.25 Fs). This is a substantial improvement in amplitude response as compared with the response of filter 10 shown in FIG. 2.

Figure 10:
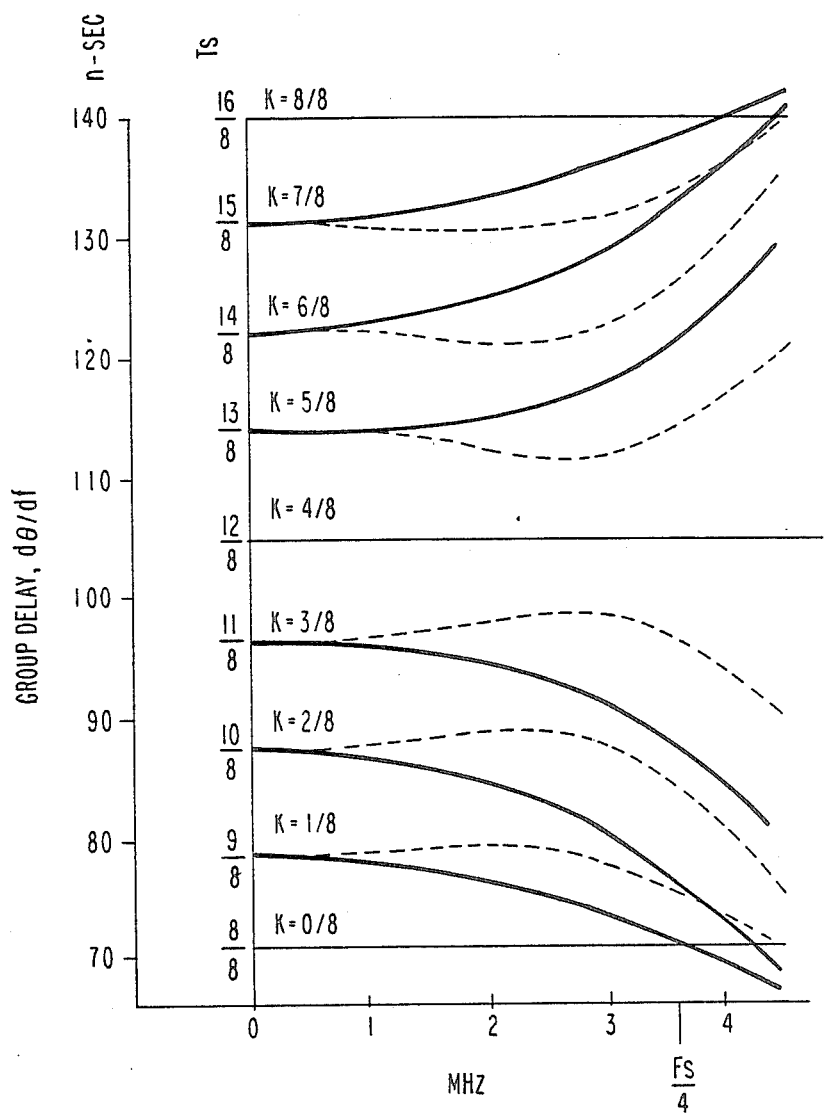
FIG. 10 is a diagram comparing the group delay characteristics of the apparatus of FIG. 6 with those of the prior art apparatus of FIG. 1.

FIG. 10 contrasts the group delay response of the delay apparatus of FIG. 6 (dashed lines, signal S12) with that of the un-compensated linear interpolation filter 10 (solid lines, signal S4). The group delay is shown both in nano-seconds and in terms of the sampling period, Ts. Note that the group delay provided by the compensated filter is substantially independent of frequency from zero to a frequency above Fs/4 for values of K of 1/8, 2/8, 3/8, 5/8, 6/8 and 7/8 whereas the un-compensated filter exhibits substantial errors of about Ts/8 for the same values of K at Fs/4.

Figure 11:
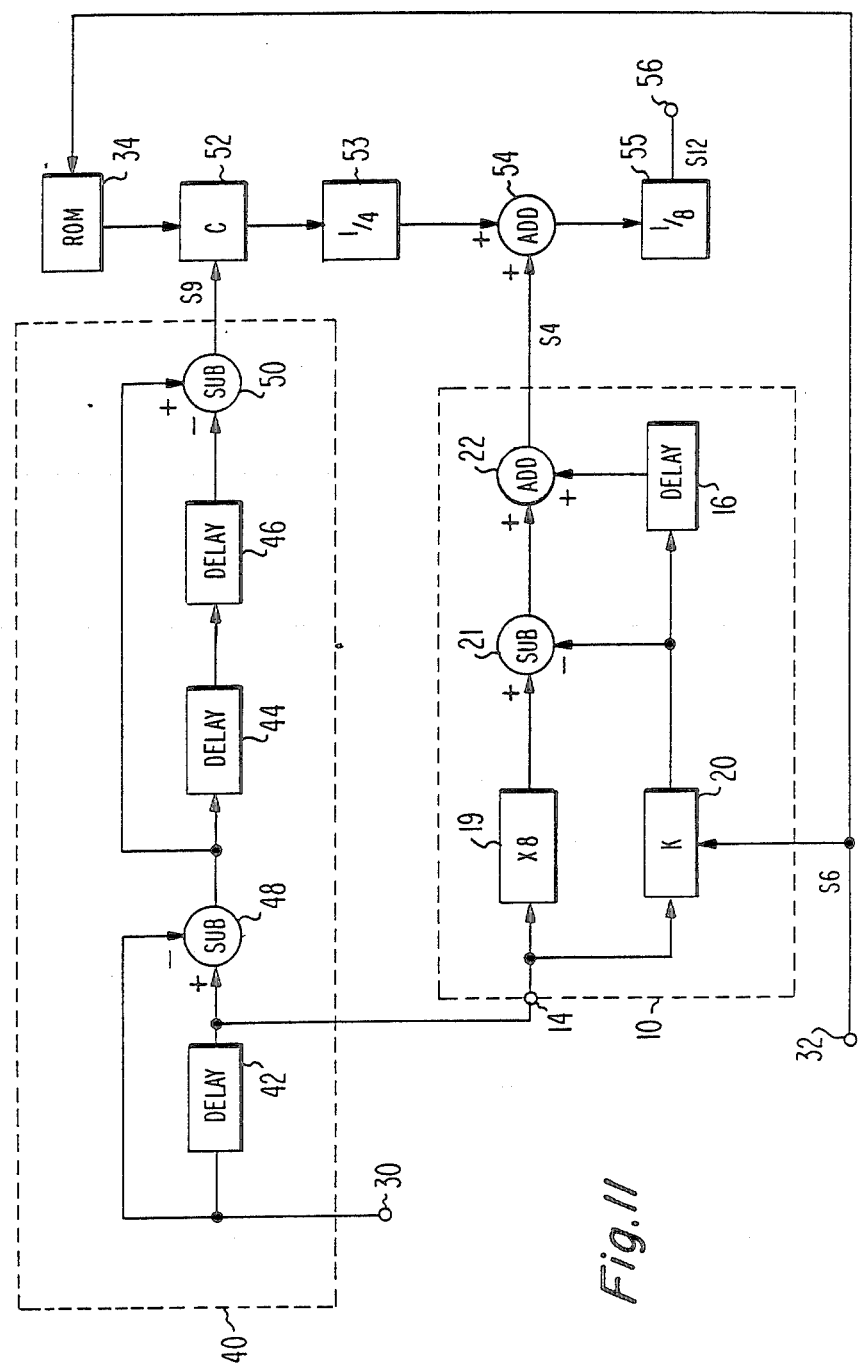
FIG. 11 is a block diagram illustrating certain modifications of the delay apparatus of FIG. 6.

FIG. 11 illustrates various modifications to the apparatus of FIG. 6. Delay element 36, for example, has been eliminated by coupling the input 14 of filter 10 to the output of delay element 42 in filter 40. Accordingly, filter 40, in addition to providing the phase compensation for filter 10, also provides the one sample period minimum delay of signal S2 in the interpolation filter signal path.

Another change in FIG. 11 is that a multiplier 53 has been inserted in the path between multiplier 52 and adder 54 and a multiplier 55 has been inserted in the path between adder 54 and output 56. The multiplication or scaling factors are ¼ and ⅛, respectively. As a result, signal S9 is effectively divided by 32. This enables the amplitude control signal "C" to be provided by an integer (e.g., a two bit binary number) between 0 and 3. The ROM 34 is programmed as shown in the table of FIG. 14 to convert the number K (a three bit binary number ranging from 0 to 7) to the number "C". Alternatively, this conversion may be provided by means of discrete logic gates. The multiplication by integers and division by the factors ¼ and ⅛ result mathematically in exactly the same scaling factors shown in the table of FIG. 10 for signal S9 and so the compensation provided is exactly the same as in FIG. 4 although the structure is different. The reason that the division factor 1/32 is split into two factors ¼ and ⅛ is that a change is also made in filter 10 to provide for multiplication by integers in determining the delay, as will be explained.

A further change in FIG. 5 is that the linear interpolation filter 10 has been changed to a different structure which is mathematically equivalent to the former structure but does not require multiplication by the factor 1−K. This eliminates the need for multiplier 18 and also reduces the memory requirements for ROM 34 since the 1−K factors do not have to be generated from K.

Considering now the details of the changes, terminal 14 is coupled to a times-eight (×8) multiplier 19 and to the input of multiplier 20 which is controlled by signal S6 which represents the delay control signal "K" which, in this example of the invention, is an integer as shown in FIG. 14. Since the output signal is ultimately divided by eight in unit 55, the effective value of "K" is the same as in the example of FIG. 6, namely, a fraction which varies in steps of ⅛. Since K is in integer in filter 10, the signal S2 is multiplied by 8 in multiplier 19 to compensate for the scaled-up signal levels in filter 10 that are eventually scaled-down by the same factor (⅛) in divider 55.

A subtractor 21 subtracts the output of multiplier 20 from the output of multiplier 19. Adder 22 is connected to add the output of multiplier 20 (delayed by Ts in delay element 16) to the output of subtractor 21 to generate the delayed signal S4. The transfer function of the modified filter is mathematically identical to its previous form (except for the ×B scaling factor) and so the amplitude and phase response is unchanged from that of the apparatus of FIG. 4.

It is a feature of the delay apparatus of FIG. 11 that the number of variable coefficient binary multipliers has been reduced from three to two thereby greatly simplifying the structure of the apparatus. The multipliers which have been added (e.g., 19, 53 and 55), are fixed coefficient multipliers with coefficients that are powers of two. This requires only a shift left for multiplication by an integer (e.g., ×8) or a shift right for multiplication by a fraction (e.g., ¼ or ⅛) and is provided by appropriate connection of the signal conductors. To multiply by eight, for example, three zeros are added to the least significant bit positions of the binary number. This function may be provided by connecting the 3 LSB inputs of the additive input of subtractor 21 to logic zero level (e.g., ground) and applying signal S2 to the remaining higher ordered inputs of the subtractor. Multiplication by negative powers of 2 comprises discarding bits. In adder 54, for example, division by 4 of signal S9 may be accomplished by applying only the third LSB and higher ordered bits of signal S9 to the adder inputs. Accordingly, the net effect of addition of fixed constant multipliers and deletion of the variable coefficient multiplier 18 in the apparatus of FIG. 11 substantially simplifies construction of the apparatus. Specifically, the apparatus employs only two variable coefficient multipliers, one (52) in the S9 signal path and one (20) in the interpolation filter.

Figure 12:
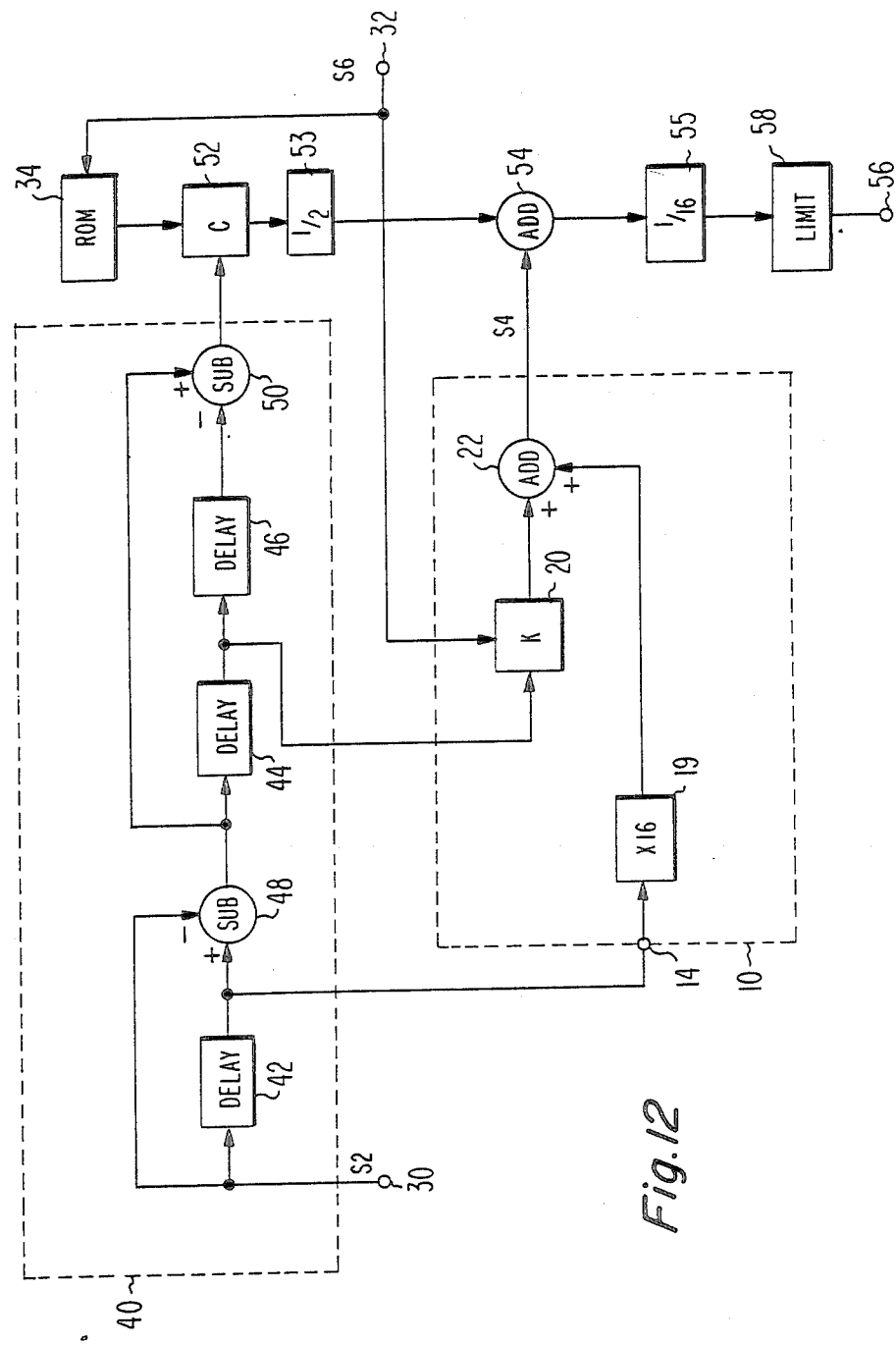
FIG. 12 is a block diagram illustrating certain modifications of the apparatus of FIG. 11.

FIG. 12 illustrates a modification of the apparatus of FIG. 11 for doubling the delay resolution and eliminating a number of circuit elements without altering the circuit functions or changing the overall performance characteristics. The structure of filter 10 has been greatly simplified by relying on filter 40 to provide certain signal delay and substraction functions formerly performed by separate elements in filter 10.

The resolution is doubled by changing the multiplication factors of multipliers 53, 55 and 19 to ½, 1/16 and 16, respectively. Signals S6 is changed to a four bit binary number ranging from 0 to 15. ROM 34 is reprogrammed as shown in the table of FIG. 15 to provide the indicated values of the multiplier control signal "C" for the indicated sixteen values of K (from zero to 15). With these changes, the delay ranges from Ts to (31 Ts)/16 in steps of Ts/16 rather than Ts/8. The delay equals one plus (K/16) times Ts as shown in FIG. 15. Filter 10, as modified, comprises only multipliers 19 and 20 and adder 22. Multiplier 19 is connected to multiply the output of delay element 42 in filter 40 by 16 which, as previously explained, scales-up the delayed signal S2 by the same factor that it is ultimated scaled-down by in multiplier 55. This allows integer multiplication in multiplier 20 rather than fractional multiplication in the example of the invention shown in FIG. 6. Multiplier 20 is connected to multiply the output of delay element 44 in filter 40 by signal S6. Adder 22 adds the output of multipliers 19 and 20 to form output signal S4. In operation, functions, such as signal delay and subtraction previously provided by separate elements in filter 10 are provided by substractor 48 and delay element 44 in filter 40. This sharing of common elements provides a desirable reduction in circuit complexity without changing the amplitude and phase characteristics in any respect other than to double the delay resolution.

What is claimed is:

1. Delay apparatus, comprising;
   a first source for providing a digital input signal having a given sampling period;
   a second source for providing a delay control signal;
   first filter means coupled to said sources for delaying said digital input signal as a function of said delay control signal in fractional increments of said sampling period by linear interpolation of adjacent samples of said digital input signal to provide a delayed digital output signal;
   second filter means coupled to said first source for providing a compensating signal, said second filter means being of a type having a response zero at zero frequency and a delay equal to an odd multiple of one-half of said sampling period;
   output means for combining said compensating and delayed signals to provide a resultant digital output signal; and
   amplitude control means connected in cascade with said second filter means for controlling the amplitude of said compensating signal as a predetermined function of said delay control signal for minimizing variations in both the amplitude and the delay with frequency of said resultant signal.

2. Delay apparatus as recited in claim 1 wherein said delay of said second filter means is greater than said sampling period and further comprising delay means coupled in series with said first filter means for imparting a minimum delay to said delayed digital output signal of at least one sampling period.

3. Delay apparatus as recited in claim 2 wherein said second filter means includes a plurality of delay elements and wherein said delay means for imparting said minimum delay to said delayed digital output signal of said first filter means comprises a selected one said elements in said second filter means.

4. Delay apparatus as recited in claim 1 wherein said amplitude control means varies the amplitude of said compensating signal as a non-linear function of said delay control signal, said non-linear function having a maximum value for values of said delay control signal corresponding to an odd multiple of one half of said sampling interval.

5. Delay apparatus as recited in claim 1 wherein said second filter means has a filter function expressed in terms of z-transform notation as $H(z) = -1 + Z^{-1} + Z^{-2} - Z^{-3}$.

6. Delay apparatus, comprising:
   two-point linear interpolation filter means having first input means coupled to receive a digital input signal to be delayed, having second input means for receiving a delay control signal and having output means for providing a digital output signal variably delayed as a function of said delay control signal, said filter means having characteristic amplitude and phase errors, said digital input signal having a given sampling period;
   second filter means having input means coupled to receive said digital input signal and output means for providing a delayed signal representative of said digital input signal delayed by an amount equal to and odd-multiple of one-half said sampling period;
   amplitude control means connected in cascade with said second filter means and responsive to said delay control signal for varying the amplitude of said delayed signal as a non-linear function of said delay control signal for producing a compensating signal of variable magnitude and constant delay; and
   output means for combining said compensating signal with said digital output signal to provide a resultant output signal in which said amplitude errors and phase errors characteristic of said two-point linear interpolation filter are reduced.

7. Delay apparatus as recited in claim 6 further comprising
   first arithmetic processing means coupled in said cascade connection with said second filter means and said amplitude control means for providing fixed attenuation of said compensating signal by a first predetermined factor, less than unity; and
   second arithmetic processing means coupled to said output means for providing fixed attenuation of said resultant output signal by a second predetermined factor, also less than unity.

8. Delay apparatus as recited in claim 5 wherein said second filter means has a filter function expressed in terms of z-transform notation as $H(z) = -1 + Z^{-1} + Z^{-2} - Z^{-3}$.

* * * * *